(12) United States Patent
Hasegawa et al.

(10) Patent No.: US 6,474,537 B1
(45) Date of Patent: Nov. 5, 2002

(54) SOLDERING METHOD USING A CU-CONTAINING LEAD-FREE ALLOY

(75) Inventors: Seiichiro Hasegawa, Kamagaya (JP); Eietsu Hasegawa, Satte (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 09/904,096

(22) Filed: Jul. 13, 2001

(51) Int. Cl.⁷ .................. B23K 31/02; B23K 31/12; B23K 31/00
(52) U.S. Cl. ............... 228/260; 228/103; 228/108.1
(58) Field of Search .................. 228/102, 103, 228/180.1, 260, 262.1; 428/646

(56) References Cited

U.S. PATENT DOCUMENTS

| | | | |
|---|---|---|---|
| 3,570,721 A | * | 3/1971 | Cushman .................. 222/319 |
| 6,180,055 B1 | * | 1/2001 | Tetsuro .................. 420/560 |
| 6,334,570 B1 | * | 1/2002 | Koshi et al. ........... 228/180.22 |
| 6,340,110 B1 | * | 1/2002 | Nakamura et al. ....... 228/179.1 |

FOREIGN PATENT DOCUMENTS

JP 2001-237536 * 8/2001

* cited by examiner

*Primary Examiner*—Tom Dunn
*Assistant Examiner*—Zidia Pittman
(74) *Attorney, Agent, or Firm*—Michael Tobias

(57) ABSTRACT

Members to be soldered, such as printed circuit boards having electronic parts mounted thereon, are subjected to flow soldering in a solder bath with a Cu-containing lead-free solder. When the molten solder in the solder bath falls below a prescribed level, the molten solder is replenished with a material having a lower Cu content than the initial composition of the solder bath. Flow soldering can be continued for long periods with the Cu content of the solder bath being maintained substantially constant.

13 Claims, No Drawings

SOLDERING METHOD USING A CU-CONTAINING LEAD-FREE ALLOY

BACKGROUND OF THE INVENTION

This invention relates to a soldering method using a lead-free alloy containing copper. More particularly, it relates to a continuous flow soldering method using such an alloy.

Electronic parts mounted on printed circuit boards are used in a wide variety of electrical products, electronic devices, and communications equipment. Electronic parts must be connected to a printed circuit board in a manner which both secures the parts to the printed circuit board and forms an electrical connection. The connection of electronic parts to printed circuit boards is usually carried out by soldering.

A typical conventional solder used for soldering of printed circuit boards is a Sn—Pb alloy, and particularly a 63Sn—Pb eutectic solder. This eutectic solder has a low melting point of 183° C., so soldering can be performed at a temperature which does not produce thermal damage of electronic parts. In addition, a 63Sn—Pb solder has good wettability. Therefore, this solder has the excellent property that it produces few soldering defects.

However, when products such as those described above containing printed circuit boards soldered with a Sn—Pb solder are discarded and disposed of by burying underground, the Sn—Pb solder may cause pollution of underground water. In recent years, the acidification of rainwater to form acid rain has been progressing due to the wide use of fossil fuels. When acid rain contacts lead-containing solder in discarded equipment buried underground, the acid rain can dissolve out the lead in the solder, and the dissolved lead may enter into underground water and pollute the water supply. Accordingly, for environmental reasons, the use of lead-free solders is being promoted for the soldering of electronic parts.

A typical lead-free solder has Sn as a primary component and further contains one or more alloying elements selected from Cu, Ag, Bi, In, Ni, Zn, P, Ge, Ga, and the like. For the soldering of electronic parts, a Sn—Cu lead-free solder containing a small amount of Cu (usually on the order of 1 mass % or less) is widely used. Cu is added to Sn in order to improve the mechanical properties of solder, and it has the secondary effect of lowering the melting temperature of the solder, which results in less thermal damage to parts being soldered.

Commonly used soldering methods include soldering with a soldering iron, reflow soldering, and flow soldering. Continuous soldering of printed circuit boards on which electronic parts are mounted is usually performed by reflow soldering or flow soldering.

In reflow soldering, a solder paste which is a mixture of solder powder and a flux is applied to portions of members to be soldered, and then the members are heated in a furnace to melt the solder powder. This method is generally used for soldering of surface mounted devices on printed circuit boards.

In flow soldering, the surface of a printed circuit board or other member to be soldered is contacted with molten solder in a solder bath. Although this method can be applied to soldering of surface mounted devices, it is more commonly used to solder electronic parts having leads on a printed circuit board, the leads of the electronic parts being inserted into through holes in the printed circuit boards and secured to the board by soldering on the surface of the board facing away the electronic parts. The type of flow soldering most commonly used with printed circuit boards is the wave soldering method, in which a wave is formed on the surface of molten solder, and the printed circuit boards are conveyed with the surface to be soldered facing downwards to contact the wave of molten solder. Another type of flow soldering is the dipping method, in which a printed circuit board or other member is dipped into a solder bath having a stationary surface. In the following description, flow soldering will refer to the wave soldering method since it is much more popular than dipping method.

When flow soldering of printed circuit boards is carried out using a Cu-containing lead-free solder, soldering defects and thermal damage to electronic parts tend to occur more frequently than with reflow soldering. Accordingly, there is a need for improvements in flow soldering methods when employing a Cu-containing lead-free solder.

SUMMARY OF THE INVENTION

The present inventors noticed that the primary reason for the high occurrence of soldering defects and thermal damage to electronic parts when flow soldering is carried out with a Cu-containing lead-free solder is an increase in the Cu-content of the molten solder bath with the passage of time.

The surface of a printed circuit board to be contacted with molten solder by flow (wave) soldering normally has areas of Cu exposed on that surface, which are typically in the form of lands or pads located in or near portions to be soldered. When the exposed Cu contacts molten solder in a solder bath, some of the Cu dissolves into the molten solder, and during continuous soldering, the amount of Cu contained in the molten solder progressively increases. If the molten solder is a Cu-containing lead-free solder, the Cu in the molten solder restrains the dissolving out of Cu from the printed circuit board to a certain extent, but even so, due to the activity of Sn (the primary component of the solder) for dissolving Cu, the Cu content of the molten solder gradually increases.

Since the desired Cu content of a Cu-containing lead-free solder is normally as low as 1 mass % or less, even a slight increase in the Cu content of the solder may have an appreciable adverse effect on soldering. Thus, the solderability of the molten solder become worse and soldering defects can more readily occur. In addition, as the Cu content of the molten solder increases, the liquidus temperature of the solder increases, and particularly when the Cu content exceeds the solubility of Cu, precipitation of Sn—Cu intermetallic compounds occurs, and in order to dissolve such compounds, it is necessary to increase the soldering temperature. However, doing so imparts thermal damage to electronic parts. Thus, even though the length of time for which individual printed circuit boards contact molten solder in a solder bath during flow soldering is only a few seconds, the adverse effects of dissolving out of Cu from printed circuit boards into molten solder on soldering operation should not be neglected.

In flow soldering using a wave solder bath, while a printed circuit board is conveyed along a given path passing over the solder bath, the lower surface of the board contacts the top of a wave of solder formed in the solder bath to perform soldering. It is important to maintain the level of molten solder in the solder bath substantially constant, since if the level becomes too low, solder does not adequately contact the lower surface of the board and unsoldered portions may result. The molten solder in the bath is gradually consumed due to adhesion to the portions to be soldered of printed circuit boards, so in a continuous soldering operation, the level of molten solder in the solder bath gradually decreases as more and more printed circuit boards undergo soldering. To prevent the level of molten solder in the solder bath from falling too low, a solder tank containing a solder bath is typically equipped with a level sensor which monitors the level of the molten solder and generates an alarm when the level falls below an allowable limit. When the alarm is generated, the solder bath is replenished by solder, normally in the form of a rod or wire, which is supplied to the solder bath either manually or automatically, to maintain the level of the solder bath in a prescribed range.

Conventionally, solder used to replenish a solder bath to maintain the level of the bath is the same as the solder which is initially used to form the molten solder in the solder bath, since it was thought that using the same solder would maintain the chemical composition of the solder bath constant. As a result, when continuous soldering of printed circuit boards or other members with exposed Cu on the surfaces thereof is carried out, the Cu content of the molten solder in the solder bath gradually increases, resulting in the problems described above.

The present invention enables the Cu content of a solder bath to be maintained at a substantially constant level to avoid the problems associated with an increasing Cu content by replenishing the solder bath with a material having a lower Cu content than the initial Cu content of the solder bath.

According to one form of the present invention, a soldering method comprises preparing a solder bath of a Cu-containing lead-free molten solder having a predetermined chemical composition, successively performing flow soldering of a plurality of members in the solder bath, the flow soldering including contacting exposed Cu on the members with the molten solder, and replenishing the solder bath with a lead-free metallic material having a lower Cu content than the predetermined composition. The material having a lower Cu content may contain Cu, or it may be free of Cu.

In a preferred embodiment, the solder bath is replenished with the lead-free metallic material when the level of molten solder in the solder bath falls to a prescribed value so as to maintain the level within a prescribed range.

The Cu-containing lead-free solder may have a variety of compositions. For example, it may be a Sn—Cu binary alloy, or a ternary or higher alloy of Sn, Cu, and one or more of the elements Ag, Bi, In, Sb, Zn, Ni, P, Ge, and Ga.

The lead-free metallic material which is used to replenish the solder bath may comprise an alloy, an elemental metal, a mixture of alloys, or a mixture of one or more alloy and one or more elemental metal. Preferably, it has essentially the same composition as the predetermined composition except for the lower Cu content. The lead-free metallic material is preferably supplied to the molten solder bath such that after replenishment, the molten solder in the solder bath has approximately the predetermined chemical composition.

DESCRIPTION OF THE PREFERRED EMBODIMENTS

A soldering method according to the present invention can be applied to continuous flow soldering of members having Cu exposed on the surface of the members to be contacted with molten solder for soldering. The flow soldering will typically be wave soldering, but it is also possible to employ dip soldering in the present invention.

Typically, the members to be soldered by flow soldering are printed circuit boards having electronic parts mounted thereon. The electronic parts may be those having leads inserted into through holes of the boards and secured to the board by soldering on the surface of the board facing away the electronic parts. Alternatively, the electronic parts may be of the surface mounted type, in which case the electronic parts are temporarily bonded to the boards with an adhesive prior to flow soldering. Typical printed circuit boards have lands or pads of Cu which are exposed on the surface of the boards to be soldered and to be contacted with molten solder.

Flow soldering is normally carried out using an automatic wave soldering apparatus. Typically, such an apparatus includes a fluxer, a preheater, a solder tank for housing a solder bath, a cooling fan, and a conveyor. A wave of molten solder is formed in the solder bath by a pump and nozzles installed in the solder tank. Printed circuit boards on which electronic parts are mounted are conveyed one after another to above the solder tank with the surface of the boards to be soldered facing down, and they are soldered by contacting the downward-facing surfaces of the boards with the wave of molten solder formed in the solder bath. The length of contact is not restricted, but it is generally on the order of 3—5 seconds.

A solder bath employed in the soldering method according to the present invention contains a Cu-containing, lead-free solder alloy of a predetermined composition. There are no particular limits on the composition of the solder alloy. A typical example of a suitable alloy is a Sn—Cu binary alloy, or a ternary or higher alloy of Sn, Cu, and one or more of Ag, Bi, In, Sb, Zn, Ni, P, Ge, Ga, and the like. The Cu content of the lead-free solder is typically in the range of 0.5–1 mass percent.

As described above, in order to maintain the level of the molten solder in a solder bath used in flow soldering within a prescribed range, it is necessary to replenish the molten solder in the solder bath from time to time, such as when a level sensor associated with the solder bath generates an alarm.

In a soldering method according to the present invention, the solder bath is replenished by the addition of a lead-free metallic material which has a lower Cu content than the predetermined composition, which is the composition of the solder alloy initially used to prepare the solder bath. Preferably the lead-free metallic material used to replenish has essentially the same composition as the predetermined composition of the solder alloy except for the lower Cu content in order to avoid the necessity of adjusting the ratio of the alloying elements other than Cu.

For example, when the molten solder alloy in the solder bath is a Sn—Cu binary alloy, examples of a lead-free metallic material which can be supplied to the solder bath to replenish it during soldering are elemental Sn, or a Sn—Cu binary alloy having a lower Cu content than the predetermined or initial composition of the solder bath. Another example of the lead-free metallic material is a mixture of elemental Sn and a Sn—Cu binary alloy at a mixing ratio which provides the mixture as a whole with a lower Cu content than the predetermined composition. The Sn—Cu binary alloy to be mixed with elemental Sn may have, for example, the same composition as the predetermined composition, i.e., it may be the same as the alloy initially used to prepare the solder bath, although a binary alloy with a different ratio of Sn to Cu can also be used. The use of a mixture of elemental Sn and a Sn—Cu binary alloy is advantageous in that the Cu content of the mixture can be easily adjusted by changing the mixing ratio of elemental Sn to the Sn—Cu binary alloy in the mixture. If the Cu content in the molten solder is analyzed prior to the addition of the mixture each time replenishment is to be performed, the ratio of elemental Sn to the Sn—Cu binary alloy in the mixture can be selected so that the chemical composition of the solder bath after replenishment will be approximately the same as the predetermined composition.

When the molten solder in the solder bath has a ternary alloy composition, some examples of a lead-free metallic material which can be added to the bath to replenish it are a Cu-free binary alloy having essentially the same composition as the predetermined ternary composition except for elimination of Cu, or a ternary alloy having essentially the same composition as the predetermined composition except for a lower Cu content, or a mixture of a Cu-free binary alloy (such as one having essentially the same composition as the predetermined composition except for the elimination of Cu) and a Cu-containing ternary alloy, such as a ternary alloy having the predetermined composition or a ternary alloy having essentially the same composition as the predetermined composition except for a lower Cu content. This same concept for selecting the lead-free metallic material can be applied when the predetermined composition of the molten solder is higher than a ternary system.

The lead-free metallic material which is added to the solder bath to replenish it is not restricted to any particular form, but it is usually a solid in the form of a rod, a wire, particles, or the like. It is not necessary to supply a lead-free metallic material having a lower Cu content than the predetermined composition each time the solder bath is replenished. For example, replenishment of the solder bath using a lead-free metallic material having a lower Cu content than the predetermined composition can be alternated with replenishment using a lead-free metallic material having the predetermined composition.

According to the present invention, when printed circuit boards are successively soldered by flow soldering using a Cu-containing lead-free solder, the occurrence of soldering defects due to an increase in the Cu content of the solder bath caused by dissolving out of Cu from the boards and thermal damage to electronic parts due to a rise in soldering temperature resulting from the increased Cu content can both be suppressed.

The present invention will be described in further detail by the following nonlimiting examples. In the examples, unless otherwise specified, % refers to mass %.

EXAMPLE 1

500 kg of a Sn-0.75%Cu-3.5%Ag lead-free solder alloy were placed in a large-sized solder tank for wave soldering equipped with a level sensor and an alarm system for generating an alarm when the level falls below a prescribed value. The solder was heated to 250° C. to melt it and form a solder bath. Using this solder bath, wave soldering of printed circuit boards for televisions having electronic parts with leads mounted thereon was carried out. After 512 printed circuit boards had been soldered, the level sensor generated an alarm. At this time, the level of the molten solder had decreased by 5 millimeters from its initial level, and the Cu content of the molten solder was determined by measurement to have increased to 0.90%. A Sn-3.5%Ag binary alloy (containing no Cu) in the form of a wire was supplied to the solder bath to replenish it until the level of the molten solder returned to its initial level. After the addition of the alloy, the Cu content of the molten solder bath was 0.76%, which was near the initial composition of the solder bath.

Thus, by performing continuous soldering while supplying a Sn-3.5%Ag alloy to the solder bath each time the level sensor generates an alarm, soldering operation can be continued over a long period without the occurrence of soldering defects or a rise in the temperature of molten solder due to an increase in the Cu content of the solder bath.

For comparison, when continuous soldering was carried out while supplying a Sn-0.75%Cu-3.5%Ag alloy (having the same composition as the initial composition of the solder bath) to the solder bath each time the level sensor generated an alarm, a large number of soldering defects occurred. The Cu content of the molten solder rose to 1.2%, the liquidus temperature rose to approximately 250° C., and the temperature of the molten solder reached approximately 270° C., so thermal damage to the electronic parts could take place.

EXAMPLE 2

380 kg of a Sn-0.75%Cu-3.5%Ag lead-free solder were placed in a mid-sized solder tank for wave soldering equipped with a level sensor and an alarm system, and the solder was heated to 250° C. to melt it and form a solder bath. Printed circuit boards for audio equipment having electronic parts with leads mounted thereon were soldered by wave soldering using the solder bath. The level sensor generated an alarm after 920 printed circuit boards had been soldered. At this time, the molten solder had decreased from its initial level by 4 millimeters, and the Cu content of the molten solder in the solder bath had increased to 0.87%. A Sn-0.3%Cu-3.5%Ag alloy in the form of a rod was added to the solder bath until the level of the molten solder returned to its initial level. After the addition of the alloy, the Cu content of the molten solder was 0.80%.

If a Sn-3.5%Ag alloy had been added to the solder bath in the same amount in place of the Sn-0.3%Cu-3.5%Ag alloy, it is estimated that the Cu content of the solder bath after addition of the alloy would have been 0.74%. If a mixture of a Sn-0.3%Cu3.5%Ag alloy and a Sn-3.5%Ag alloy with a mixing ratio of 1:1 or 1:3 had instead been added to the solder bath, it is estimated that the Cu content after addition of the mixture would have been 0.77 or 0.75%, respectively.

EXAMPLE 3

500 kg of a Sn-0.75%Cu lead-free alloy were placed in a large-sized solder tank for wave soldering equipped with a level sensor and an alarm system. The alloy was heated to 260° C. to melt it and form a solder bath. Using this solder bath, printed circuit boards for video use having electronic parts with leads mounted thereon were soldered by wave soldering. The level sensor generated an alarm after 485 printed circuit boards had been soldered. At this time, the level of the molten solder had decreased from its initial level by 6 millimeters, and the Cu content of the molten solder in the solder bath had increased to 0.92%. Granular elemental Sn was added to the bath until the liquid surface returned to its initial level. The Cu content of the solder bath after addition of Sn was 0.74%. If a mixture of elemental Sn and approximately 5 mass percent of Sn-0.75%Cu had been added to the solder bath in place of the elemental Sn, it is estimated that the Cu content of the solder bath after addition of the mixture would have been 0.75%.

What is claimed is:

1. A soldering method comprising preparing a solder bath of a Cu-containing lead-free molten solder having a predetermined chemical composition, successively performing flow soldering of a plurality of members in the solder bath, the flow soldering including contacting exposed Cu on the members with the molten solder, and replenishing the solder bath with a lead-free metallic material having a lower Cu content than the predetermined composition.

2. The soldering method as claimed in claim 1 wherein the members on which flow soldering is performed are printed circuit boards having electronic parts mounted thereon.

3. The soldering method as claimed in claim 1 wherein the molten solder comprises a Sn—Cu binary alloy.

4. The soldering method as claimed in claim 1 wherein the molten solder comprises a ternary or higher alloy of Sn, Cu, and at least one of Ag, Bi, In, Sb, Zn, Ni, P, Ge, and Ga.

5. The soldering method as claimed in claim 1 wherein the lead-free metallic material has essentially the same composition as the predetermined composition except for a lower Cu content.

6. The soldering method as claimed in claim 5 wherein the lead-free metallic material comprises a Cu-free material having essentially the same composition as the predetermined composition except for elimination of Cu.

7. The soldering method as claimed in claim 5 wherein the lead-free metallic material comprises a Cu-containing lead-free alloy having essentially the same composition as the predetermined composition except for a lower Cu content.

8. The soldering method as claimed in claim 5 wherein the lead-free metallic material comprises a mixture of an alloy having the predetermined composition and a metallic substance having a lower Cu content than the predetermined composition.

9. The soldering method as claimed in claim 8 wherein the metallic substance comprises a Cu-free metallic substance having essentially the same composition as the predetermined composition except for elimination of Cu.

10. The soldering method as claimed in claim 8 including measuring the composition of the molten solder after commencing soldering and before replenishing the solder bath, and adjusting a ratio of the alloy and the metallic substance in the mixture based on the measured composition of the molten solder such that the composition of the molten solder after replenishment will be approximately the predetermined composition.

11. The soldering method as claimed in claim 1 wherein the composition of the bath is approximately the predetermined composition after replenishment with the lead-free metallic material.

12. The soldering method as claimed in claim 1 including replenishing the solder bath when a level of the molten solder in the solder bath falls to a prescribed level.

13. A soldering method comprising:

preparing a solder bath of a Cu-containing lead-free molten solder having a predetermined chemical composition;

successively performing flow soldering in the solder bath of a plurality of printed circuit boards each having electronic parts mounted thereon, the flow soldering including contacting exposed Cu on at least one of the printed circuit boards and the electronic parts with the molten solder;

monitoring a level of molten solder in the solder bath; and supplying a lead-free metallic material having a lower Cu content than the predetermined composition to the solder bath to replenish the solder bath when a level of molten solder in the solder bath falls to a prescribed level.

* * * * *